(12) United States Patent
Frambach

(10) Patent No.: US 8,712,350 B2
(45) Date of Patent: Apr. 29, 2014

(54) RF AMPLIFIER WITH DIGITAL FILTER FOR POLAR TRANSMITTER

(75) Inventor: Johannes Petrus Antonius Frambach, Nijmegen (NL)

(73) Assignee: ST-Ericsson SA, Plan-les-Ouates (CH)

( * ) Notice: Subject to any disclaimer, the term of this patent is extended or adjusted under 35 U.S.C. 154(b) by 70 days.

(21) Appl. No.: 13/319,633

(22) PCT Filed: May 10, 2010

(86) PCT No.: PCT/EP2010/056363
§ 371 (c)(1),
(2), (4) Date: Nov. 9, 2011

(87) PCT Pub. No.: WO2010/130688
PCT Pub. Date: Nov. 18, 2010

(65) Prior Publication Data
US 2012/0056676 A1     Mar. 8, 2012

(30) Foreign Application Priority Data

May 12, 2009   (EP) .................................... 09160027

(51) Int. Cl.
*H01Q 11/12*     (2006.01)
*H04B 1/04*      (2006.01)

(52) U.S. Cl.
USPC ................... 455/127.1; 455/127.2; 455/127.3

(58) Field of Classification Search
USPC ........... 455/102, 108–113, 114.2–114.3, 116, 455/118, 127.1–127.5; 375/295–298, 375/300–302, 312
See application file for complete search history.

(56) References Cited

U.S. PATENT DOCUMENTS

| | | | | |
|---|---|---|---|---|
| 6,124,815 | A * | 9/2000 | Lee et al. ....................... | 341/143 |
| 6,697,436 | B1 * | 2/2004 | Wright et al. ................. | 375/296 |
| 6,791,399 | B2 * | 9/2004 | Jaussi et al. ................... | 327/553 |
| 6,865,235 | B2 * | 3/2005 | Khoini-Poorfard ........... | 375/272 |
| 7,061,989 | B2 * | 6/2006 | Bellaouar et al. ............. | 375/295 |
| 7,151,913 | B2 * | 12/2006 | Ahmed ........................... | 455/91 |
| 7,236,112 | B2 * | 6/2007 | Hickling ....................... | 341/143 |
| 7,469,491 | B2 * | 12/2008 | McCallister et al. ......... | 375/296 |
| 7,504,976 | B1 * | 3/2009 | Pellon ............................ | 341/143 |
| 7,596,174 | B2 * | 9/2009 | Canagasaby et al. ......... | 375/229 |
| 7,840,193 | B2 * | 11/2010 | Hara et al. .................... | 455/102 |
| 7,881,399 | B2 * | 2/2011 | Matsuura ...................... | 375/295 |
| 2005/0018790 | A1 | 1/2005 | Liu | |

(Continued)

OTHER PUBLICATIONS

International Search Report for PCT/EP2010/056363 mailed Jun. 6, 2010.

(Continued)

*Primary Examiner* — Simon Nguyen
(74) *Attorney, Agent, or Firm* — Patent Portfolio Builders PLLC

(57) ABSTRACT

An RF power amplifier for a polar transmitter converts an amplitude component signal into a 1-bit digital amplitude signal, which is fed to a digital finite impulse response filter. Successive taps of the filter each have an RF amplification stage arranged to amplify successively delayed versions of the 1-bit digital amplitude signal, the amplifying being according to a respective tap coefficient, and according to the RF carrier modulated by the phase component. The filter is arranged to combine the outputs of the taps to provide the amplified RF signal. The power amplifier uses a one bit stream which therefore has only two states (2 values), thus achieving linearity in principle. Device mismatch between taps does not lead to non-linearity or distortion.

15 Claims, 3 Drawing Sheets

(56) References Cited

U.S. PATENT DOCUMENTS

| | | | |
|---|---|---|---|
| 2005/0111567 A1* | 5/2005 | Hsu et al. | 375/295 |
| 2005/0141604 A1* | 6/2005 | Zirkle | 375/229 |
| 2005/0287967 A1* | 12/2005 | Hung et al. | 455/127.2 |
| 2007/0129030 A1* | 6/2007 | Litmanen et al. | 455/127.1 |
| 2007/0160164 A1 | 7/2007 | Sahota | |
| 2007/0275676 A1 | 11/2007 | Rofougaran et al. | |
| 2008/0186218 A1* | 8/2008 | Ohkuri et al. | 341/143 |
| 2009/0004981 A1* | 1/2009 | Eliezer et al. | 455/127.1 |
| 2009/0110217 A1* | 4/2009 | Yasuda et al. | 381/120 |

OTHER PUBLICATIONS

Written Opinion for PCT/EP2010/056363 mailed Jun. 6, 2010.
Van Zeijl, P., et al., "A Digital Envelope Modulator for a WLAN OFDM Polar Transmitter in 90 nm CMOS," IEEE Journal of Solid-State Circuits, vol. 42, No. 10, Oct. 2007, pp. 2204-2210, XP011193080.
Van Zeijl, P., et al., "A Multi-Standard Digital Envelope Modulator for Polar Transmitters in 90 nm CMOS," IEEE Radio Frequency Integrated Circuits Symposium, Jun. 1, 2007, pp. 373-376, XP031113051.
International Preliminary Report on Patentability issued in corresponding International Application No. PCT/EP2010/056363 on Nov. 15, 2011.
Written Opinion of the International Searching Authority issued in corresponding International Application No. PCT/EP2010/056363, mailing date Jul. 6, 2010.

* cited by examiner

RF AMPLIFIER WITH DIGITAL FILTER FOR POLAR TRANSMITTER

FIELD OF THE INVENTION

This invention relates to power amplifiers especially RF power amplifiers, and corresponding transmitters, transceivers, integrated circuits and methods of operating the same.

BACKGROUND OF THE INVENTION

It is known from US 2007275676 that modern wireless RF transmitters for applications such as cellular, personal, and satellite communications, employ digital modulation schemes, such as frequency shift keying (FSK), phase shift keying (PSK), and variants thereof, often in combination with code division multiple access (CDMA) communication. The RF transmitter output signal will have an envelope which in some of the above mentioned communication schemes is a constant envelope, and in other communications schemes will vary with time. An example of a variable-envelope modulation scheme is that known as a polar transmitter. In a polar transmitter, digital baseband data enters a digital processor that performs the necessary pulse shaping and modulation to some intermediate frequency (IF) carrier fIF to generate digital envelope (amplitude-modulated) and digital phase-modulated signals. The digital amplitude-modulated signal is input to a digital-to-analog converter (DAC), followed by a low pass filter (LPF), along an amplitude path. The digital phase-modulated signal is input to another DAC, followed by another LPF, along a phase path. The output of the LPF on the amplitude path is an analog amplitude signal, while the output of the LPF on the phase path is an analog reference signal. The analog reference signal is input to a phase locked loop to enable the phase of the RF output signal to track the phase of the analog reference signal. The RF output signal is modulated in a non-linear power amplifier (PA) by the analog amplitude-modulated signal.

Thus, in polar transmitter architectures, the phase component of the RF signal is amplified through the non-linear PA while the amplitude modulation is performed at the output of the PA. This architecture, however, requires phase and amplitude alignment to make sure that the amplitude modulated and phase modulated data are applied at the right instant. In addition, polar transmitters also have several challenges related to amplitude modulation and power control. Conventional amplitude modulation techniques are typically based on the modulation of the power supply. However, the amplitude component of the RF signal occupies several times more bandwidth than the combination of the phase and amplitude data. Therefore, conventional power supply modulation techniques are limited for many wideband applications. In addition, in many wireless systems, the output power must be controlled in order to keep the received signal from reaching all users at the same power level. However, in switching power amplifiers, the power control is performed using the same method as that used for amplitude modulation. As a result, in switching power amplifiers, there is a trade off between the power control dynamic range and the resolution of the amplitude modulation. Furthermore, the AM signal path needs to be extremely linear. Any distortion leads to unacceptable spectral power emissions ("spectral leakage" or "spectral regrowth") in neighbouring transmit channels.

A multi stage power amplifier is provided in the above mentioned US 2007275676 to address problems with Local Oscillator leakage. The leakage current is orthogonal to the drain current of the switching transistor due to the 90° phase difference of the capacitor's voltage and current. As a result, when the amplitude modulation is applied, there is a variation in the carrier's phase due to the leakage which is a function of the carrier's envelope (amplitude). This effect is known as the AM to PM conversion, and is critical when the power amplifier operates at high output power level. To compensate for the AM to PM conversion in polar transmitters, a pre-distortion filter or phase feedback loop can be employed. In addition to or in the alternative to using a pre-distortion filter and/or phase feedback loop, cascode transistors can be used on top of the switching transistors, which also reduces the voltage variation over the switching transistors, and therefore reduces the AM to PM conversion.

In low power operation, the LO leakage through the CGD capacitor can be comparable or even higher than the output RF signal. As a result, the leakage covers the RF signal at the output, and therefore limits the power control dynamic range. The leakage signal may also limit the linearity of the amplitude modulation at low power operations. To overcome the leakage problem at low power, the switch size is decreased for low power levels by providing multiple stages in the power amplifier. For example it can be divided to three stages with switch size ratios of *1, *8 and *64. Each stage includes a switch pair and a corresponding tail current source. Each current source is operably coupled to receive the amplitude-modulated signal and the power control bits to control current through its respective switch pair and each stage is associated with a different power level to minimize leakage at low power levels. Switches connected to each switch pair select one or more of the stages to generate the appropriate output power for the power amplifier, or the stage selection can be made using the most significant bits (MSBs) of the power control word to turn on the appropriate stages. The remaining least significant bits (LSBs) can be used to control the tail current. Turning off the large stages improves the linearity of the power amplifier in low power operation.

It is also known to use a so called "RF DAC" or "Envelope DAC", which is essentially a switching RF power amplifier combined with a multi-bit Nyquist DAC. See e.g. P. T. M van Zeijl, M. Collados, "A Digital Envelope Modulator for a WLAN OFDM Polar Transmitter in 90 nm CMOS", IEEE Journal of Solid-State Circuits, October 2007. The "RF DAC" (=the PA) can provide predictability/exactness in time, necessary for correct AM and PM recombination, by directly feeding the digitised amplitude data into the PA. Hence the propagation delay can be known to within 100 ps. The amplitude exactness however depends on the device matching of the binary weighted unit cells that constitute the PA. As these devices need to operate at RF, usually several GHz, their dimensions need to be small. Consequently the matching will be poor (matching scales with area). To alleviate this problem the "RF DAC" can be constructed from thermometer encoded unit cells, rather than binary weighted unit cells. The impairments can be engineered to an acceptable low level, but in principle, device mismatch will impair faithful reconstruction of the AM signal.

SUMMARY OF THE INVENTION

An object of the invention is to provide power amplifiers especially RF power amplifiers, and corresponding transmitters, transceivers, integrated circuits and methods of operating the same.

According to a first aspect, the invention provides:

A power amplifier such as an RF power amplifier having a converter which converts the amplitude component signal into a 1-bit digital amplitude signal, which is fed to a digital finite impulse response filter. For example, successive taps of the filter each have an amplification stage such as an RF amplification stage arranged to amplify successively delayed versions of the 1-bit digital amplitude signal, the amplifying being according to a respective tap coefficient, and according to the RF carrier modulated by the phase component. The filter is arranged to combine the outputs of the taps to provide the amplified RF signal.

In accordance with embodiments of the present invention the amplifier according can be used with frequencies such as 25 kHz or larger, e.g. as used in wireless communications from long wave radio up to ultra wide band (UWB) wireless transmissions, or cable transmissions such as ADSL, up to the level of 150 GHz or 300 GHz.

The proposed power amplifier PA, dubbed "FIR-PA" or "bit-stream PA", uses a one bit stream which therefore has only two states (2 values), thus achieving linearity in principle. Due to the 1-bit bit-stream, the digitally coded amplitude component can be exactly and faithfully reproduced in the amplified output.

Embodiments of the invention can have any other features added, some such additional features are set out in dependent claims and described in more detail below.

Other aspects of the invention include corresponding methods. Any of the additional features can be combined together and combined with any of the aspects. Other advantages will be apparent to those skilled in the art, especially over other prior art. Numerous variations and modifications can be made without departing from the claims of the present invention. Therefore, it should be clearly understood that the form of the present invention is illustrative only and is not intended to limit the scope of the present invention.

BRIEF DESCRIPTION OF THE DRAWINGS

How the present invention may be put into effect will now be described by way of example with reference to the appended drawings, in which.

DETAILED DESCRIPTION OF EMBODIMENTS

Figure 1:
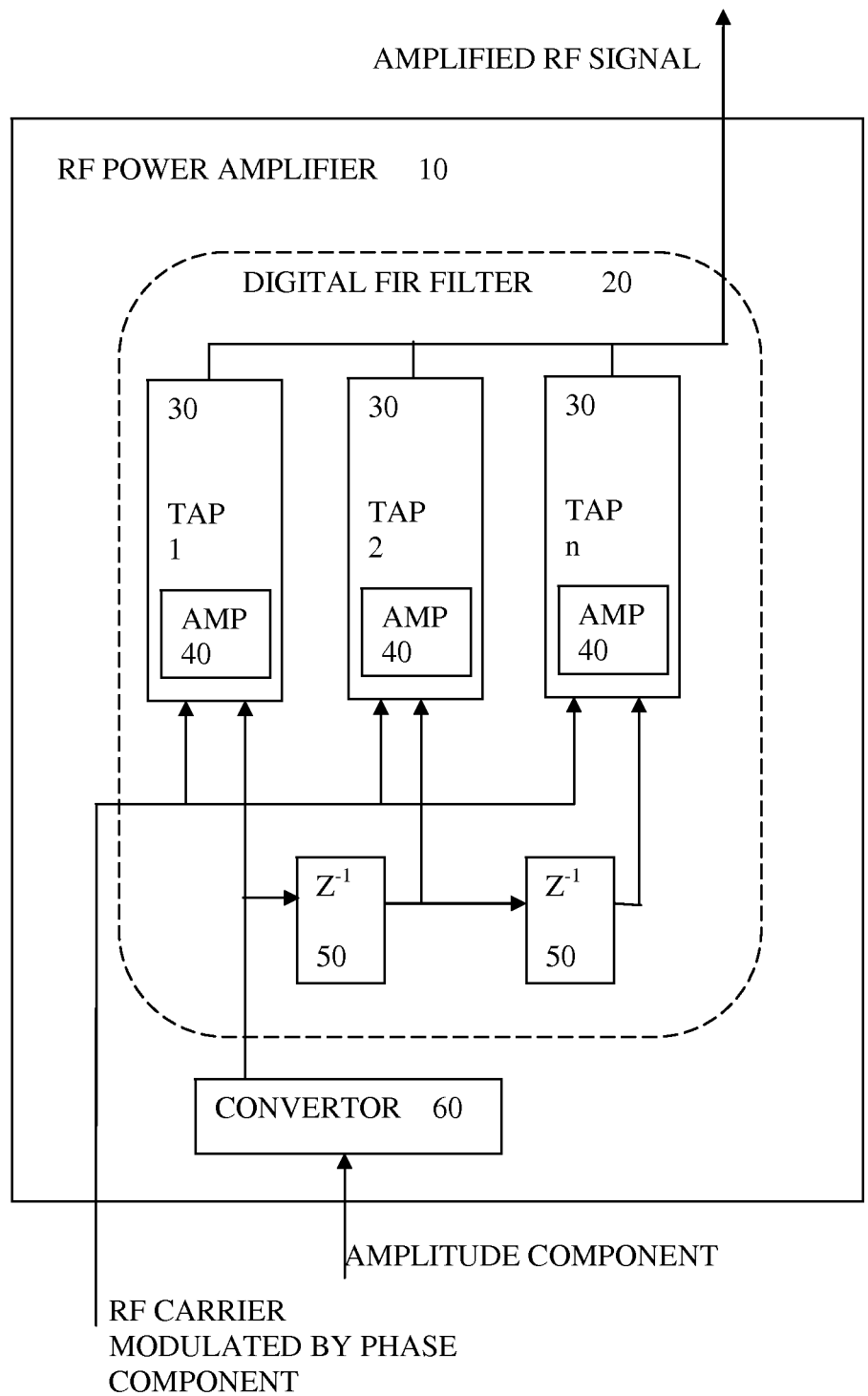
FIG. 1 shows apparatus according to a first embodiment.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. Where the term "comprising" is used in the present description and claims, it does not exclude other elements or steps. Where an indefinite or definite article is used when referring to a singular noun e.g. "a" or "an", "the", this includes a plural of that noun unless something else is specifically stated.

The term "comprising", used in the claims, should not be interpreted as being restricted to the means listed thereafter; it does not exclude other elements or steps. Thus, the scope of the expression "a device comprising means A and B" should not be limited to devices consisting only of components A and B. It means that with respect to the present invention, the only relevant components of the device are A and B.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the invention. References to a signal can encompass any kind of signal in any medium, and so can encompass an electrical or optical or wireless signal or other signal for example. References to analyzing can encompass processing a signal in any way to derive or enhance information about the material. References to a processor can encompass any means for processing signals or data in any form and so can encompass for example a personal computer, a microprocessor, analog circuitry, application specific integrated circuits, software for the same, and so on.

The term Radio frequency (RF) is a frequency or rate of oscillation which can lie within the range of about 3 Hz to 300

Ghz and is particularly relevant to the range 25 kHz to 300 GHz and more particularly 25 kHz to 150 GHz in accordance with this invention. This range corresponds to frequency of AC electrical signals used to produce and detect radio waves. RF refers to oscillations in air or in electrical circuits. Accordingly, references to RF encompass any frequencies used for broadcasting through air or space or for cable transmission such as ADSL, VDSL, SDSL, etc.

Radio frequencies may be classified as follows:

Extremely low frequency, e.g. 3-30 Hz. Super low frequencies, e.g. 30-300 Hz. Ultralow frequency, e.g. 300-3000 Hz, Very Low Frequency, e.g. 3-25 kHz, Low Frequency, e.g. 25 to 300 kHz, e.g. as used in AM broadcasting, Medium frequency, e.g. 300-3000 kHz f 100-1000 m, High Frequency e.g. g 3-30 MHz, Very High frequency, e.g. 30-300 MHz, Ultra High frequency, e.g. 300-3000 MHz, and Super High Frequency, e.g. 3-30 GHz, Extremely high frequency, e.g. 30-300 GHz.

In accordance with embodiments of the present invention the amplifier according can be used with frequencies such as 25 kHz or larger, e.g. as used in cable transmissions such as ADSL, up to the level of 150 GHz or 300 GHz.

In the description provided herein, numerous specific details are set forth. However, it is understood that embodiments of the invention may be practised without these specific details. In other instances, well-known methods, structures and techniques have not been shown in detail in order not to obscure an understanding of this description.

Introduction to Some Issues Addressed by Some of the Embodiments

By way of introduction to the embodiments, the problem of modern wireless transceivers that should be integrated in deep sub-micron CMOS processes will be discussed. They should employ architecture and circuit concepts to yield robust implementation in these "digitally" driven processes. One of those concepts is the Polar Transmitter. The Polar Transmitter decomposes an arbitrary RF vector in Amplitude (AM) and Phase (PM), rather than In-phase and Quadrature-phase (I/Q) components. The PM component is transferred from base band to RF by means of a Phase Locked Loop (PLL). In deep sub-micron processes usually a so called Digital PLL (DPLL). The AM component can be treated in several ways, but both signals, AM and PM, need to be recombined before the Antenna. Usually this happens in the Power Amplifier, which is then called a "Polar Power Amplifier". For successful recombination, the AM and PM signals should be properly aligned in time. Since the AM and the PM path have quite different natures, time alignment is not intrinsic to the architecture, but needs careful design.

Furthermore, the AM signal path needs to be extremely linear. Any distortion leads to unacceptable spectral power emissions ("spectral leakage" or "spectral regrowth") in neighbouring transmit channels. For these reasons, in the embodiments described, the AM signal path will be processed in a "digital" manner, to make it linear-by-design and to make the propagation delay both exact and predictable.

Introduction to Features of the Embodiments

In embodiments of the power amplifier especially of the RF power amplifier according to the present invention, a converter converts the amplitude component signal into a 1-bit digital amplitude signal, which is fed to a digital finite impulse response filter. Successive taps of the filter each have an amplification stage, e.g. an RF amplification stage arranged to amplify successively delayed versions of the 1-bit digital amplitude signal. The amplifying is preferably carried out according to a respective tap coefficient, and according to the RF carrier modulated by the phase component. The filter is arranged to combine the outputs of the taps to provide the amplified RF signal.

The power amplifier PA, dubbed "FIR-PA" or "bit-stream PA", uses a one bit stream which therefore has only two states (2 values), thus achieving linearity in principle (since two points can always be connected with a straight line). The amplitude component (AM) signal is coded in a 1-bit bitstream, by any kind of converter. One example is a converter using pulse width modulation, others can be conceived by the skilled person and are included within the scope of this invention. An example of a converter is a Sigma Delta Modulator (SDM). This is a known device which can convert an m-bit AM input signal into a 1-bit signal by oversampling and noise shaping. The resulting bit-stream is exact in amplitude and time, the requirements recognised above for successful signal recombination at the antenna.

The noise shaping of the SDM results in low in-band noise floor but high out-of-band noise. In a wireless system a low level or no spectral emissions should occur on neighbouring channels. The out-of-band noise needs to be suppressed by a sharp filter (steep roll-off outside the bandwidth of interest). An analog implementation of such a filter will have significant group-delay (and group-delay variation over the pass-band), violating time-alignment requirements. A digital FIR filter normally provides a sharp roll-off outside the pass-band with a constant group-delay. A FIR filter can also be implemented in a "semi-digital" manner, meaning that the delay is exact (digital) and the tap-coefficients are analog, e.g. switched current sources. Such filters are known from audio applications for example. Embodiments described can be seen as being based on a particular combination of a "semi-digital" FIR with a Polar PA.

In some embodiments the amplification stage of each tap comprises an analog component dimensioned according to the respective tap coefficient. This can involve for example designing the dimensions of a transistor according to the respective tap coefficient. The amplification stage of each tap can comprise a switched current source arranged to supply a current representing the respective tap coefficient. This can be combined with the dimensioning of the analog component, or be an alternative. This can involve more components, but can simplify the design if there is less need to provide different dimensions for all the taps.

The switched current sources can be programmable. This can enable dynamic alteration of filtering to enable multi standard operation or allow software programmable filtering for example.

The amplification stage of each tap can comprise a switch and cascode arrangement of transistors. The amplification stage of each tap can comprise a current minor. Each tap can have a gate for gating the respectively delayed version of the 1-bit digital amplitude signal according to the RF carrier modulated by the phase component. This is one way of making the amplification according to the RF carrier modulated by the phase component. By doing so in the digital domain, linearity and timing are preserved better, and cross talk at lower signal levels is reduced, since some of the amplification stages are not active.

The taps can have a controllable common reference current for all the amplification stages, to enable overall RF output power control.

The power amplifier especially the RF power amplifier can be implemented in a sub micron CMOS integrated circuit with other parts. This is useful for greater levels of integration of digital circuitry. It can be part of a transceiver having a polar transmitter. In use for transmitting an RF signal, an amplitude component signal is converted into a 1-bit digital amplitude signal, which is fed to a digital finite impulse response filter so that successive taps of the filter each amplify successively delayed versions of the 1-bit digital amplitude signal. The amplifying is done according to a respective tap coefficient, and according to the RF carrier modulated by the phase component. Combining the outputs of the taps provides an amplified RF signal for the transmission.

An RF Power Amplifier (PA), suitable for a Polar Transmitter is described. It can be directly AM modulated by a digital bit-stream (1-bit). The PA is inherently linear-by-design, since the 1-bit stream has only 2 states. The bit-stream can be noise shaped by a Sigma Delta Modulator (SDM). In order to suppress the out-of-band noise introduced by the noise shaping, the PA acts as a Finite Impulse Response filter (FIR-filter) with a steep roll-off. In contrast to other "digitally" modulated PA's, device mismatch does not lead to amplitude distortion. The amplitude is coded in the bit stream and not in the weight of the unit elements of the PA, so the amplitude can be faithfully reproduced without distortion, even in the presence of device mismatch. Device mismatch otherwise leads to variations in the out-of-band noise and in the PA's group-delay. The output power of the PA can be controlled by a DC current and is very robust to process, temperature and supply voltage variations (PVT). The PA can be very suitable for wireless transceivers that should be integrated in deep sub-micron CMOS processes.

FIG. 1, a First Embodiment

In the embodiment of FIG. 1, an RF power amplifier 10 is shown having a converter 60 and a digital finite impulse response FIR filter 20. The converter converts the amplitude component signal into a 1-bit digital amplitude signal, which is fed to the digital finite impulse response filter. The filter has a number of delay elements 50 which provide successively delayed versions of the amplitude signal to successive taps 30 of the filter. Three taps are shown, but there can be many more. Each tap has an RF amplification stage 40 arranged to amplify the delayed versions of the 1-bit digital amplitude signal, the amplifying being according to a respective tap coefficient. Each amplification stage also has an input of an RF carrier modulated by the phase component. The filter is arranged to combine the outputs of the taps to provide the amplified RF signal. This can be fed to an antenna, or waveguide, or any transmission medium. The modulation of the RF carrier by the phase component can be carried out using a PLL as described above, or in other ways.

There are various ways of implementing the various parts of FIG. 1. Some will be described in more detail below with reference to FIGS. 2 and 3. Conventional circuit components such as transistors or logic gates can be used, in the form of discrete components or integrated circuits to suit the application.

Figure 2:
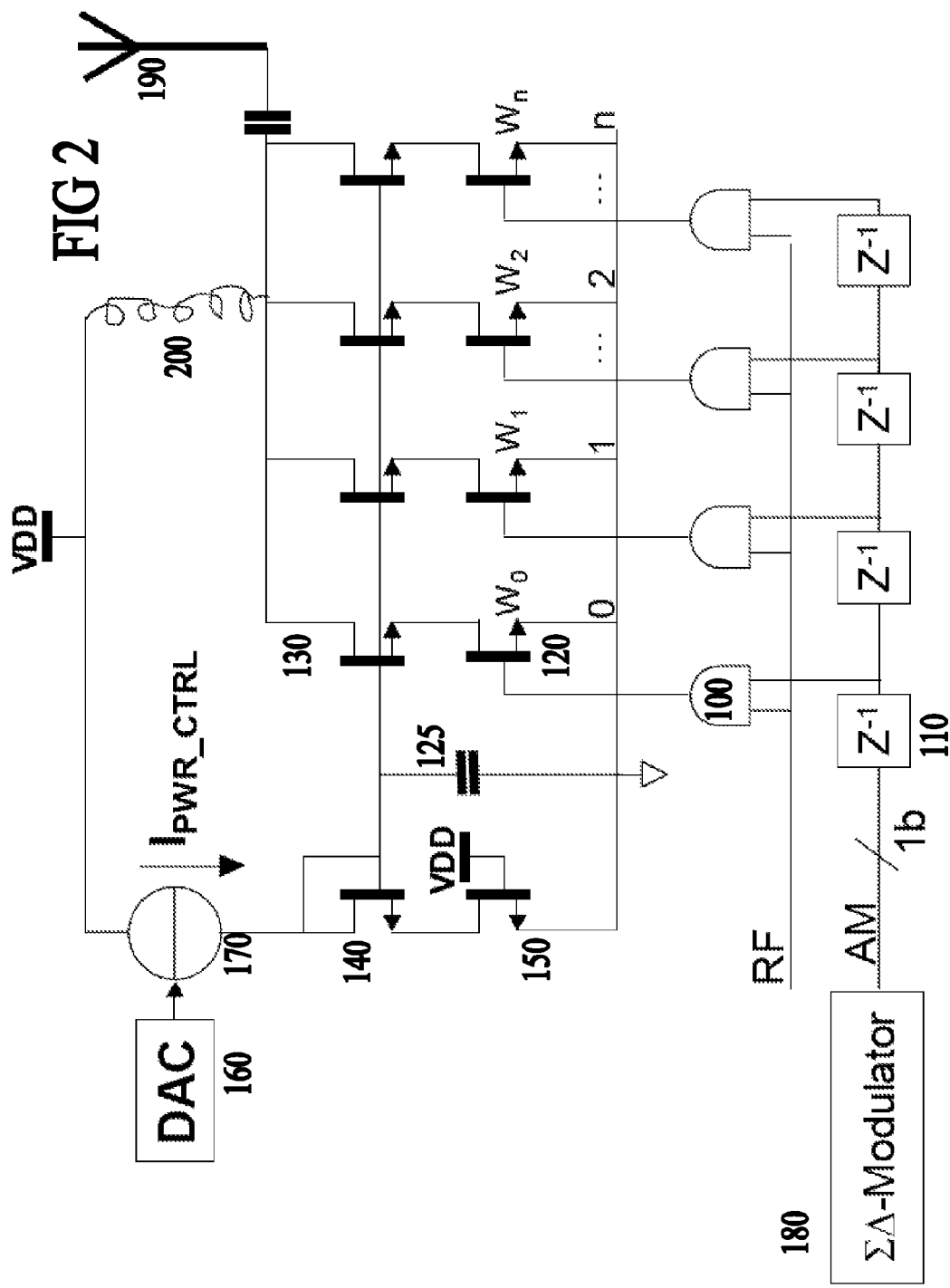
FIG. 2 shows apparatus according to a second embodiment.

FIG. 2, a Second Embodiment

This figure shows an RF power amplifier having a digital FIR of N unit cells, the taps of a Nth-order FIR filter. Each unit cell consists of a delay element $Z^{-1}$ 110 (e.g. implemented with a flip-flop), a gate such as an AND gate 100, and an amplifying stage in the form of an RF switch NMOS transistor (bottom NMOS 120) and a Cascode NMOS (top NMOS 130). The drains of the Cascodes of the N unit cells are combined and connected to the antenna 190. The digital AM signal is converted to a 1-bit digital signal by a converter in the form of a Sigma Delta Modulator 180. The AND gates combine the AM bit-stream and the RF carrier. The RF switch transistors 120 have weights W0 ... Wn, as per the required tap coefficients weights to constitute the desired filter response. The weighting is achieved by using different dimensions for the switch transistors of different taps. The diode connected NMOS 140 on the left and dummy RF transistor 150, provide a relatively simple DC means to control the PA's output power. A DAC 160 provides a power control signal to a current source 170 coupled to the diode connected NMOS 140. The DAC acts as an interface to enable software or digital control of the power. Also, an inductive connection 200 is shown providing a DC coupling to the combined output.

The large capacitor 125 provides RF decoupling of the Cascode gates, rendering these transistors into well known "common gate" amplifiers. The Cascode gates are typically of thick oxide type to ensure reliable operation at high voltage (much higher than the technology's core voltage), required to achieve substantial output power.

Figure 3:
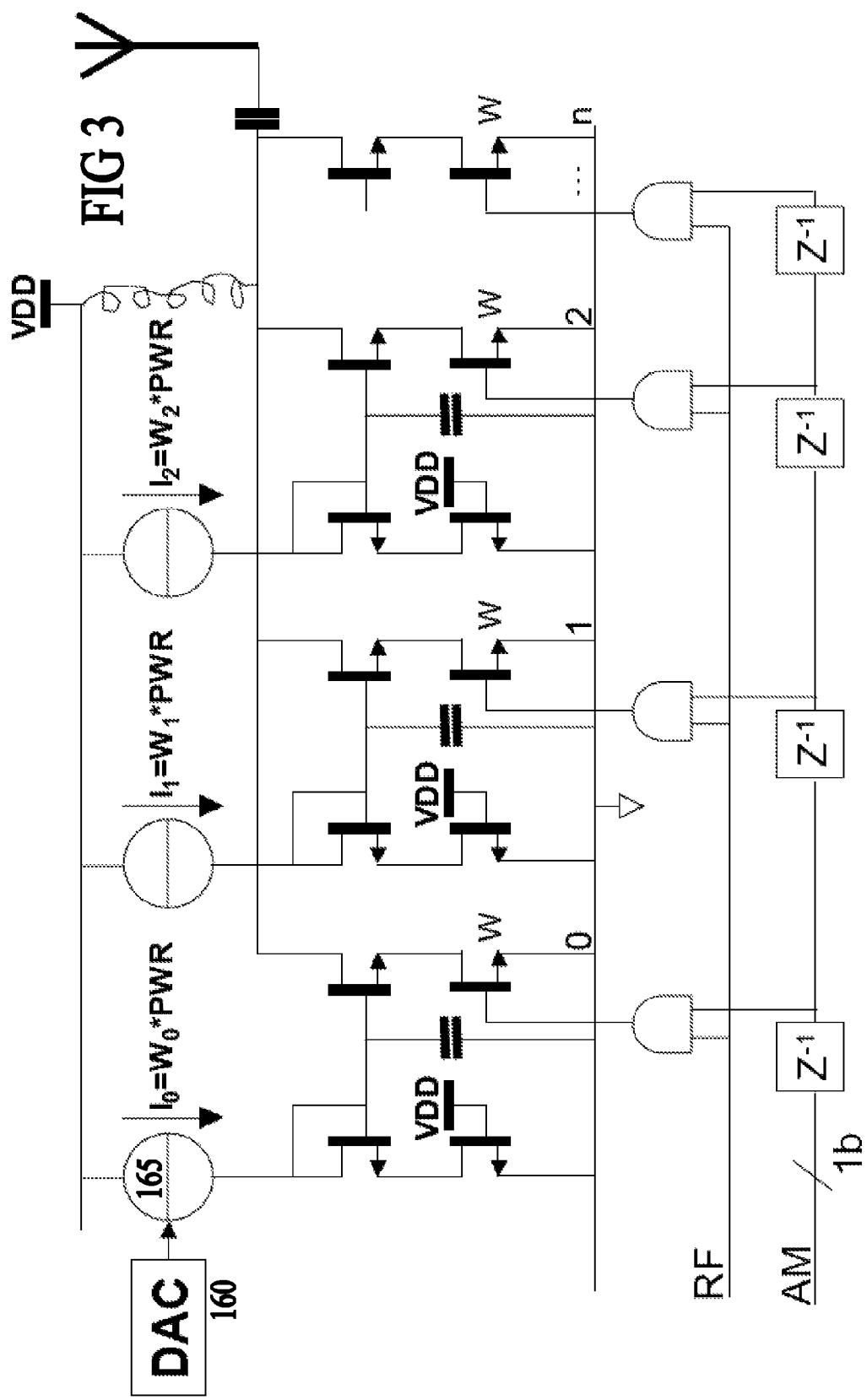
FIG. 3 shows apparatus according to a third embodiment.

FIG. 3, a Third Embodiment

In the embodiment of FIG. 3, some parts are similar to FIG. 2 and corresponding reference signs are used as appropriate. Each unit PA cell consists of a delay element, an AND gate, an RF switch transistor and a current mirror, doubling as the Cascode transistor. Unlike FIG. 2, all unit cells have the same dimensions W for the transistors. The weight of the FIR filter tap coefficient is no longer determined by the dimensions, but instead is determined by the DC current provided by individual current sources 165 into each unit mirror. In this embodiment since all RF transistors have the same dimensions, there is good matching of RF characteristics and easier design of the layout. The matching of the tap coefficients is determined by DC transistors (the current sources I0 ... In, 165) can have a large size (since there are no RF constraints, only DC).

Power control is achieved by controlling a common reference current to alter the full scale current of all current sources together. The current sources constitute a current mirror, hence power control is a matter of changing the reference current. Each current source outputs a current representing A weighting W multiplied by a power level PWR. Optionally the current sources can be individually programmable current sources. When the current sources for the different taps can each have an arbitrary value, any conceivable FIR filter frequency characteristic can be synthesized. In doing so, the power amplifier's out-of-band noise can be shaped to suit the application at hand, in other words "filter-on-demand". This can be useful for production "tweaking" or for multi-mode systems, where different requirements apply for different standards. This allows software programmable filtering of the out-of-band noise, an interesting property for Software Defined Radio, SDR.

Applications and Other Matters

A notable property of at least some embodiments is that they are linear-by-design. Due to the 1-bit bit-stream, the digitally coded AM signal of the polar modulator can be exactly and faithfully reproduced at the antenna. In fact the only non-linearity is caused by the Early effect of the Cascode transistor. This effect is unavoidable if a cascode transistor is used, regardless of the operating principle, analog or "digital".

Further favourable properties of some features of some embodiments are:

The AM and PM signal are recombined by the AND gate in a digital manner

Device mismatch between unit cells does not lead to non-linearity or distortion.

Device mismatch otherwise leads to group-delay and out-of-band noise variations.

Cross-talk of the RF carrier from gate to drain of the bottom transistor scales with amplitude.

A logic "0" blocks the RF carrier in the AND gate, so no signal is present on the gate of the RF transistor. Only cells driven by a logic "1" are active, contributing cross-talk. The lower the amplitude, the more units are "0", the lower the cross-talk. Consequently also small signals can be faithfully reproduced (which is usually a problem).

Signal propagation delay is exact and known a priori all the way up to the RF transistor.

PA's output power only depends on a DC reference current (I_PWR_CTRL).

Also allows for >>30 dB (linear) power control.

Most Process, Temperature and Supply Voltage variations (PVT) are exterminated.

Robust to manufacturing tolerances.

Cascode transistor can be properly decoupled for RF, achieving "common gate" characteristics.

Thick oxide Cascode transistors can offer good reliability at high supply voltage.

It can protect the sensitive RF transistors against high voltage and ESD

The power amplifiers described can be applied in wireless transmitters and transceivers intended to be integrated in deep sub-micron CMOS SoC's (System on a chip) (but can also be used stand-alone). It is particularly useful for wireless standards that could employ a Polar Transmitter, requiring a PA that can be directly modulated by digital controls, both in AM and in PM.

Typical applications include a Wireless SoC, employing a Bluetooth and Cellular Radio. Without restricting the applications, this FIR-PA is particularly suitable for a Digital Polar Transmitter, in conjunction with a Digital PLL. One of the embodiments could be useful for Software Defined Radio, enabling a multi-standard multimode RF Transmitter. Applications can be in transmitters for Bluetooth/FM-radio in 45 nm CMOS "CLN45" or PNX6730 [Cellular Baseband with Bluetooth/GPS/FM-radio] in 45 nm CMOS "CLN45".

Other variations can be envisaged within the scope of the claims.

The invention claimed is:

1. An RF power amplifier for providing an amplified RF signal based on an amplitude component signal and an RF carrier modulated by a phase component, the RF power amplifier comprising:

a converter for converting the amplitude component signal into a 1-bit digital amplitude signal, and a digital finite impulse response filter fed by the 1-bit digital amplitude signal, wherein successive taps of the filter each includes an RF amplification stage arranged to amplify successively delayed versions of the 1-bit digital amplitude signal, the amplifying being performed according to a respective tap coefficient, and according to the RF carrier modulated by the phase component, wherein the filter is arranged to combine outputs of the taps to provide the amplified RF signal.

2. The RF power amplifier of claim 1, wherein the RF amplification stage of each tap includes an analog component dimensioned according to the respective tap coefficient.

3. The RF power amplifier of claim 1, wherein the RF amplification stage of each tap includes a switched current source arranged to supply a current representing the respective tap coefficient.

4. The RF power amplifier of claim 3, wherein switched current sources are programmable.

5. The RF power amplifier of claim 1, wherein the RF amplification stage of each tap includes a switch and cascode arrangement of transistors.

6. The RF power amplifier of claim 1, wherein the RF amplification stage of each tap includes a current mirror.

7. The RF power amplifier of claim 1, wherein each tap includes a gate for gating the respectively delayed version of the 1-bit digital amplitude signal according to the RF carrier modulated by the phase component, to make the amplification according to the RF carrier modulated by the phase component.

8. The RF power amplifier of claim 1, arranged to have a controllable common reference current for all the RF amplification stages, to enable overall RF output power control.

9. The RF power amplifier of claim 1, wherein the converter includes a sigma delta modulator.

10. A sub micron CMOS integrated circuit comprising the RF power amplifier of claim 1.

11. A transceiver having a polar transmitter having the RF power amplifier of claim 1.

12. A method of amplifying an RF signal, having the steps of:

converting an amplitude component signal into a 1-bit digital amplitude signal, feeding this signal to a digital finite impulse response filter so that successive taps of the filter each amplifies successively delayed versions of the 1-bit digital amplitude signal, wherein the amplifying is according to a respective tap coefficient, and according to the RF carrier modulated by the phase component, combining outputs of the taps to provide an amplified RF signal.

13. The method of claim 12, further comprising wireless transmission of the amplified signal.

14. The method of claim 12, wherein each tap comprises a gate, the method further including gating the respectively delayed version of the 1-bit digital amplitude signal according to the RF carrier modulated by the phase component, to make the amplification according to the RF carrier modulated by the phase component.

15. The method of claim 12, wherein the amplification step of each tap includes supplying a current representing the respective tap coefficient.

* * * * *